United States Patent
Kang et al.

(10) Patent No.: US 9,418,915 B2
(45) Date of Patent: Aug. 16, 2016

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Sin-Woo Kang, Suwon-si (KR); Sung-Dong Cho, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/526,479

(22) Filed: Oct. 28, 2014

(65) Prior Publication Data

US 2015/0200152 A1 Jul. 16, 2015

(30) Foreign Application Priority Data

Jan. 16, 2014 (KR) .................. 10-2014-0005585
Jul. 16, 2014 (KR) .................. 10-2014-0089902

(51) Int. Cl.
| | |
|---|---|
| *H01L 23/48* | (2006.01) |
| *H01L 21/768* | (2006.01) |
| *H01L 27/06* | (2006.01) |
| *H01L 21/74* | (2006.01) |

(52) U.S. Cl.
CPC ........ *H01L 23/481* (2013.01); *H01L 21/76898* (2013.01); *H01L 21/74* (2013.01); *H01L 27/0617* (2013.01); *H01L 2924/0002* (2013.01)

(58) Field of Classification Search
CPC ... H01L 23/481; H01L 27/04; H01L 29/0649; H01L 29/78
USPC ........................................................ 257/401
See application file for complete search history.

(56) References Cited

U.S. PATENT DOCUMENTS

| | | | |
|---|---|---|---|
| 7,772,081 B2 | 8/2010 | Lin et al. | |
| 8,048,794 B2 | 11/2011 | Knickerbocker | |
| 8,133,781 B2 | 3/2012 | Ervin et al. | |
| 8,264,065 B2 | 9/2012 | Su et al. | |
| 8,476,145 B2 | 7/2013 | Or-Bach et al. | |
| 2010/0255682 A1 | 10/2010 | Trickett et al. | |
| 2012/0056331 A1 | 3/2012 | Park | |
| 2012/0074515 A1* | 3/2012 | Chen ................. | H01L 23/585 257/491 |
| 2012/0080802 A1* | 4/2012 | Cheng ................ | H01L 23/481 257/774 |
| 2012/0129341 A1 | 5/2012 | Jo et al. | |
| 2012/0135566 A1 | 5/2012 | Pinguet et al. | |
| 2012/0162947 A1 | 6/2012 | O'Donnell et al. | |

(Continued)

FOREIGN PATENT DOCUMENTS

| | | |
|---|---|---|
| JP | 2010219429 A | 9/2010 |
| JP | 2013105770 A | 5/2013 |
| KR | 20120045402 A | 5/2012 |

*Primary Examiner* — Karen Kusumakar
*Assistant Examiner* — Adam S Bowen
(74) *Attorney, Agent, or Firm* — Renaissance IP Law Group LLP

(57) ABSTRACT

Provided are a semiconductor device and a method for fabricating the same. The semiconductor device includes a semiconductor substrate, an interlayer insulating layer formed on the semiconductor substrate, a gate structure formed in the interlayer insulating layer, an isolation layer formed in the semiconductor substrate, a through-silicon via formed to penetrate the semiconductor substrate, the interlayer insulating layer, and the isolation layer, and a first conduction type first impurity region coming in contact with the isolation layer and formed to surround only a portion of a sidewall of the through-silicon via in the semiconductor substrate.

13 Claims, 13 Drawing Sheets

(56) References Cited

U.S. PATENT DOCUMENTS

| | | | |
|---|---|---|---|
| 2012/0199970 A1* | 8/2012 | Yun et al. | 257/737 |
| 2013/0147015 A1 | 6/2013 | Nakos et al. | |
| 2013/0147057 A1* | 6/2013 | Horng | H01L 23/481 257/774 |
| 2013/0264676 A1* | 10/2013 | Yang | H01L 23/5226 257/508 |
| 2014/0015018 A1* | 1/2014 | Kim | 257/288 |
| 2014/0317694 A1* | 10/2014 | Grube | G06F 12/1408 726/4 |

\* cited by examiner

SEMICONDUCTOR DEVICE AND METHOD FOR FABRICATING THE SAME

CROSS-REFERENCE TO RELATED APPLICATIONS

This U.S. non-provisional patent application claims priority under 35 U.S.C. §119 to Korean Patent Application No. 10-2014-0005585, filed on Jan. 16, 2014 and Korean Patent Application No. 10-2014-0089902, filed on Jul. 16, 2014, in the Korean Intellectual Property Office, the disclosure of which is hereby incorporated herein in its by reference.

BACKGROUND

The present inventive concept relates to a semiconductor device and a method for fabricating the same.

By performing various semiconductor processes, a plurality of semiconductor chips are formed on a wafer. Then, by performing a packaging process with respect to the plurality of semiconductor chips, a semiconductor package is formed. The semiconductor package may include semiconductor chips, a PCB (Printed Circuit Board) on which the semiconductor chips are mounted, bonding wires or bumps electrically connecting the semiconductor chips and the PCB to each other, and an encapsulant encapsulating the semiconductor chips.

Recently, semiconductor packages on which semiconductor devices are stacked using TSV (Through-Silicon Via) have appeared. In the case of stacking the semiconductor devices using a TSV, attachment reliability between the semiconductor devices is required.

SUMMARY

Exemplary embodiments of the present inventive concept may provide a semiconductor device including an impurity doped region to protect semiconductor elements adjacent to a TSV from charges that are generated in a process of forming the TSV.

Exemplary embodiments of the present inventive concept may also provide a method for fabricating a semiconductor device including an impurity doped region to protect semiconductor elements adjacent to a TSV from charges that are generated in a process of forming the TSV.

Additional advantages, subjects, and features of the inventive concept will be set forth in part in the description which follows and in part will become apparent to those having ordinary skill in the art upon examination of the following or may be learned from practice of the inventive concept.

According to an exemplary embodiment of the present inventive concept, a semiconductor device may include a semiconductor substrate including a first region and a second region, an interlayer insulating layer formed on the semiconductor substrate, a semiconductor element formed on the semiconductor substrate in the first region, the semiconductor element including a gate structure formed in the interlayer insulating layer, an isolation layer formed in the semiconductor substrate in the second region, a through-silicon via formed to penetrate the semiconductor substrate, the interlayer insulating layer in the to second region, and the isolation layer, and a first conduction type first impurity region contacting with the isolation layer and surrounding only a portion of a sidewall of the through-silicon via in the semiconductor substrate in the second region.

According to an exemplary embodiment of the present inventive concept, a semiconductor device may include a semiconductor substrate, an interlayer insulating layer formed on the semiconductor substrate, a semiconductor element formed on the semiconductor substrate, the semiconductor element including a gate structure formed in the interlayer insulating layer, a via hole formed to penetrate the semiconductor substrate and the interlayer insulating layer, a through-silicon via filling the via hole, and a first conduction type first impurity region arranged to overlap the gate structure in the semiconductor substrate to intercept diffusion of a second conduction type charges into the semiconductor element.

According to an exemplary embodiment of the present inventive concept, a semiconductor device may include a semiconductor substrate including a first region and a second region, an interlayer insulating layer formed on the semiconductor substrate, a semiconductor element formed on the semiconductor substrate in the first region, the semiconductor element including a gate structure formed in the interlayer insulating layer, a first isolation layer formed in the semiconductor substrate in the second region, a through-silicon via formed to penetrate the semiconductor substrate, the interlayer insulating layer in the second region, and the isolation layer, and a first conduction type first impurity region contacting with the through-silicon via and surrounding only a portion of a sidewall of the through-silicon via in the semiconductor substrate in the second region.

According to an exemplary embodiment of the present inventive concept, a method for fabricating a semiconductor device may include forming a first conduction type impurity region in a semiconductor substrate, forming an isolation layer in the semiconductor substrate to come in contact with the first conduction type impurity region, forming a semiconductor element including a gate structure on the semiconductor substrate, forming an interlayer insulating layer that covers the gate structure on the semiconductor substrate, forming a via-hole that penetrates the semiconductor substrate, the isolation layer, and the interlayer insulating layer, and forming a through-silicon via by successively forming an insulating layer and a conductive layer in the via-hole to fill the via hole.

BRIEF DESCRIPTION OF THE DRAWINGS

The above and other objects, features and advantages of the present inventive to concept will be more apparent from the following detailed description taken in conjunction with the accompanying drawings, in which.

DETAILED DESCRIPTION OF THE EMBODIMENTS

Figure 1:
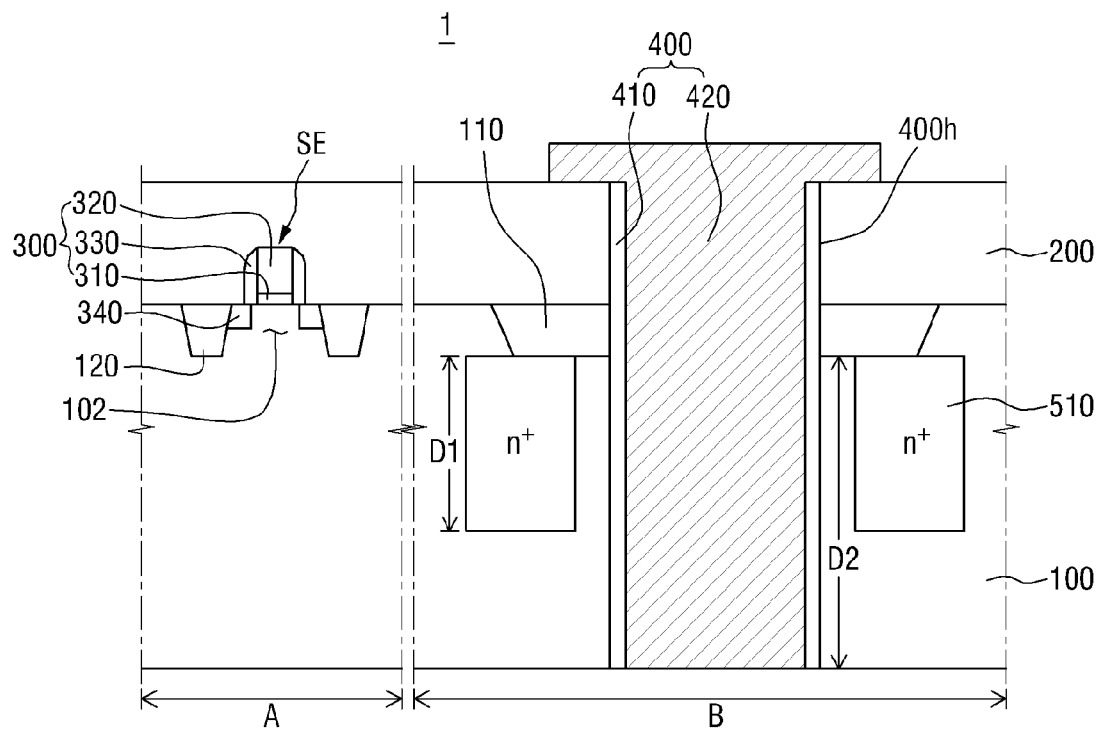
FIG. 1 is a cross-sectional view of a semiconductor device according to a first embodiment of the present inventive concept.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are to illustrated in schematic form and the shapes of the regions are presented simply by way of illustration and not as a limitation.

According to a semiconductor device and a method for fabricating the same to be described hereinafter, a semiconductor substrate is prevented from being affected by charges that is generated in a RIE (Reactive Ion Etching) process when a TSV (Through-Silicon Via) structure is formed. The RIE process is a dry etching method for etching a wafer by applying an RF (Radio Frequency) voltage to an electrode on which the wafer is put, lowering processing pressure, and accelerating plasma-state ions through plasma sheath. The charges generated in the above-described process may move to the semiconductor substrate or semiconductor elements adjacent to the TSV, thereby deteriorating the semiconductor device characteristics. According to the present inventive concept, the charges generated in the RIE process can be prevented from being diffused into the semiconductor substrate or the neighboring semiconductor elements.

Figure 2:
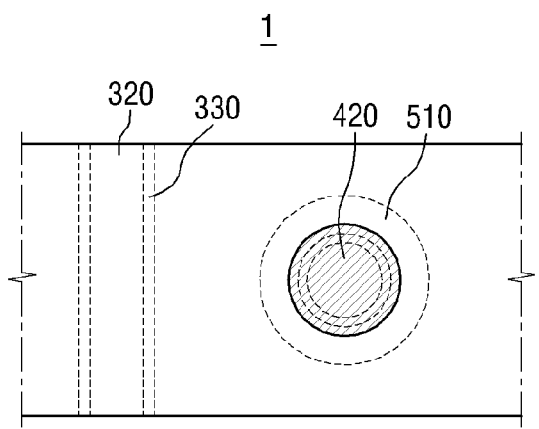
FIG. 2 is a layout diagram of a semiconductor device according to a first embodiment of the present inventive concept.

FIG. 1 is a cross-sectional view of a semiconductor device according to a first embodiment of the present inventive concept, and FIG. 2 is a layout diagram of a semiconductor device according to a first embodiment of the present inventive concept.

Referring to FIGS. 1 and 2, a semiconductor device 1 according to a first embodiment of the present inventive concept includes a semiconductor substrate 100, a first isolation layer 110, a second isolation layer 120, an interlayer insulating layer 200, a semiconductor element SE including a gate structure 300, a through-silicon via 400, and a first impurity region 510.

The semiconductor substrate 100 may include a first region A and a second region B. The first region A may be, for example, a region in which a semiconductor element SE including the gate structure 300 may be formed, and the second region B may be, for example, a region in which the through-silicon via 400 is formed.

The semiconductor substrate 100 may be made of one or more semiconductor materials selected from the group including Si, Ge, SiGe, GaP, GaAs, SiC, SiGeC, InAs, and InP. Further, the semiconductor substrate 100 may be a SOI (Silicon On Insulator) substrate. Further, the semiconductor substrate 100 may be a rigid substrate, such as a glass substrate for display, or a flexible plastic substrate that is made of polyimide, polyester, polycarbonate, polyethersulfone, polymethylmethacrylate, polyethylenenaphthalate, or polyethyleneterephthalate.

The first isolation layer 110 may be formed in the second region B. The first to isolation layer 110 may be formed in the semiconductor substrate 100, and may be formed, for example, on an upper surface side of the semiconductor substrate 100. The first isolation layer 110 may be formed of, for example, a STI (Shallow Trench Isolation) structure. The upper surface of the first isolation layer 110 may be substantially put on the same plane as the upper surface of the semiconductor substrate 100, but is not limited thereto. That is, the upper surface of the first isolation layer 110 may protrude from the upper surface of the semiconductor substrate 100 or may be depressed therein. The first isolation layer 110 is formed of an insulating material, and may include, for example, a silicon oxide layer. Further, although there are some differences according to the design rule of a semiconductor device, the first isolation layer 110 may be formed by spin coating method, an APCVD (Atmospheric Pressure Chemical Vapor Deposition), PECVD (Plasma Enhanced Chemical Vapor Deposition) method, or a HDP CVD (High Density Plasma Chemical Vapor Deposition) method.

The second isolation layer 120 may be formed in the first region A. The second isolation layer 120 may define an active region 102. Since explanation of the second isolation layer 120 may overlap explanation of the first isolation layer 110, it will be omitted. Although FIG. 1 illustrates that the first isolation layer 110 and the second isolation layer 120 are formed to be spaced apart from each other, the first isolation layer 110 and the second isolation layer 120 may be formed to be connected to each other.

The interlayer insulating layer 200 may be formed on the semiconductor substrate 100. The interlayer insulating layer 200 may be formed on the semiconductor substrate 100 to cover the gate structure 300 that is formed in the first region A. The interlayer insulating layer 200 may be, for example, a PMD (Pre Metal Dielectric) layer. The interlayer insulating layer 200 may include a low-k material, and may be made of, for example, TOSZ, USG, BSG, PSG, BPSG, PRTEOS, FSG, or a combination thereof.

The semiconductor element SE may be formed on the semiconductor substrate 100 of the active region 102 defined by the second isolation layer 120 in the first region A. The semiconductor element SE may include the gate structure 300 and source/drains 340. The gate structure 300 may be formed in the interlayer insulating layer 200. The gate structure 300 may be formed on the semiconductor substrate 100 of the active region 102 defined by the second isolation layer 120 in the first region A. The gate structure 300 may include a gate insulating layer 310, a gate electrode 320 formed on the gate insulating layer 310, and a spacer 330 formed on a side wall of the gate electrode 320.

The gate insulating layer 310 may include a silicon oxide layer or a high-k layer.

The gate electrode 320 may be made of a conductive material. For example, the gate electrode 320 may include a single layer, such as a poly silicon layer doped with an n-type or p-type impurity, a metal layer, a metal silicide layer, or a metal nitride layer, or a stacked layer thereof.

The gate electrode 320 may be made of a poly silicon layer, and may further include an amorphous material in addition to an n-type or p-type impurity. The amorphous material may be ion-injected. An example of an ion-injected material may include Ge, Xe, C, F, or a combination thereof. A preferable example thereof may be Ge. The poly silicon layer that forms the gate electrode 320 is amorphized according to an implantation of the amorphous material, and then recrystallized through a subsequent heat treatment. During the recrystallization, the poly silicon layer stores specific stress according to a change of a crystalline state, and this may give stress to a channel of the semiconductor element SE under the gate electrode 320.

Further, the gate electrode 320 may not include the amorphous material. In this case, stress that is given to the semiconductor element SE is caused by a stress layer that covers the semiconductor element SE. Accordingly, whether the gate electrode 320 includes the amorphous material has a close relationship with whether the stress layer for giving the stress to the channel remains.

The spacer 330 may be formed on a side wall of the gate electrode 320. The spacer 330 may be made of, for example, a silicon nitride layer.

The source/drains 340 may be formed in the semiconductor substrate 100 of the active region 102 adjacent to the gate structure 300. The source/drains 340 may be formed by doping impurities in the semiconductor substrate 100 adjacent to the gate structure 300 using an ion implantation process.

The through-silicon via 400 is formed to penetrate the semiconductor substrate 100, the first isolation layer 110, and the interlayer insulating layer 200. The through-silicon via 400 may be formed in the second region B. The through-silicon via 400 may be exposed from the lower surface of the semiconductor substrate 100. The through-silicon via 400 may be formed in a via-hole 400h. The via-hole 400h may be a hole that is formed to successively penetrate the semiconductor substrate 100, the first isolation layer 110, and the interlayer insulating layer 200. FIG. 1 illustrates that the via-hole 400h vertically penetrates the semiconductor substrate 100, the first isolation layer 110, and the interlayer insulating layer 200, but is not limited thereto. That is, the side wall of the via-hole 400h may be inclined. For example, the width of the via-hole 400h may be increased as going from the lower surface of the semiconductor substrate 100 to the upper surface of the interlayer insulating layer 200.

The through-silicon via 400 may include an insulating layer 410 and a conductive layer 420. The insulating layer 410 may be formed along the side wall of the via-hole 400h. The insulating layer 410 may insulate the semiconductor substrate 100 and the conductive layer 420 in the via-hole 400h. The insulating layer 410 may include silicon oxide or carbon-doped silicon oxide. For example, the insulating layer 410 may be formed using a plasma oxidization process or a CVD (Chemical Vapor Deposition) process, and may be formed of a TEOS layer or an ozone TEOS layer having superior step coverage characteristics. The conductive layer 420 may be formed on the insulating layer 410 in the via-hole 400h to fill the via-hole 400h. In addition, the conductive layer 420 may be formed on the interlayer insulating layer 200 in the second region B. The conductive layer 420 may be formed of a low-resistance metal material. The conductive layer 420 may be formed by depositing copper using electroplating, electroless plating, electrografting, or physical vapor deposition. After forming the conductive layer 420, a process of performing heat treatment of the conductive layer 420 may be further performed. Unlike this, the conductive layer 420 may be formed by depositing other metals having low resistance in addition to copper. The conductive layer 420 may be formed by depositing a metal material having a thermal expansion coefficient that is twice the thermal expansion coefficient of a silicon material. Specifically, the conductive layer 420 may be made of aluminum, gold, indium, or nickel. The first impurity region 510 is formed in the semiconductor substrate 100 to come in contact with the first isolation layer 110 and to surround only a portion of a sidewall of the through-silicon via 400. The first impurity region 510 may be of a first conduction type, and the first conduction type may be, for example, an n-type. The first impurity region 510 may include for example, arsenic ions, or phosphorus ions. If the first impurity region 510 is doped with n-type impurities, p-type charges that are generated in the process of forming the through-silicon via 400 are combined with the n-type impurities to be removed. If charges may be diffused into the semiconductor substrate 100, the semiconductor characteristics of the semiconductor substrate 100 may be deteriorated or the characteristics of several kinds of semiconductor elements formed in the semiconductor substrate 100 may be deteriorated. Accordingly, it is necessary to remove the charges. In the case of forming the via-hole 400h to form the through-silicon via 400, etching may be performed using the RIE process. Since charges generated in this case are p-type charges (e.g., holes), it is preferable that the first impurity region 510 is doped with the n-type impurities.

The first impurity region 510 may be formed to come in contact with the first isolation layer 110. The first impurity region 510 may be formed below the first isolation layer 110. The first impurity region 510 may serve to remove charges that are generated in the process of forming the through-silicon via 400 and to protect the semiconductor element SE. Accordingly, if the first impurity region 510 may be formed to come in contact with the first isolation layer 110, the effect of intercepting the charges from being diffused into the semiconductor element SE can be increased.

The first impurity region 510 may be formed to be spaced apart from the through-silicon via 400. If the first impurity region 510 may be formed to be spaced apart from the through-silicon via 400 by a specific distance, the effect of removing the p-type charges that are generated in the process of forming the through-silicon via 400 can be increased. This is because if the first impurity region 510 has an equal width, the existence of a region where the first impurity region 510 is formed far apart from the through-silicon via 400 can increase the effect of intercepting the p-type charges from being diffused into the semiconductor element SE.

The depth D1 with which the first impurity region 510 may be formed may be shallower than the depth D2 with which the through-silicon via 400 is formed. That is, the first impurity region 510 may be formed to surround only the upper side of the through-silicon via 400. If an ion implantation process may be performed to form the first impurity region 510 with a depth with which the through-silicon via 400 is formed, there may be technical difficulty to increase the processing cost. Accordingly, it is preferable to form the first impurity region 510 with a depth enough to protect the semiconductor element SE positioned on the upper surface side of the semiconductor substrate 100.

The doping concentration of the first impurity region 510 may be, for example, 1E14 to 1E16 ions/cm$^3$. The first impurity region 510 may be a high-concentration doping region, and in the case where the doping concentration of the first impurity region 510 is 1E14 to 1E16 ions/cm$^3$, the effect of the present inventive concept can be increased. In the case of low-concentration doping in which the doping concentration of the first impurity region 510 may be equal to or lower than 1E14 ions/cm$^3$, the effect of intercepting charges from being diffused into the semiconductor element SE is decreased. Further, in consideration of the fabricating cost to form the first impurity region 510, the process efficiency may be decreased in the case where the doping concentration of the first impurity region 510 may be higher than 1E16 ions/cm$^3$. The first impurity region 510 may be formed using, for example, an ion implantation process.

Hereinafter, a semiconductor device according to other embodiments of the present inventive concept will be described.

Figure 3:
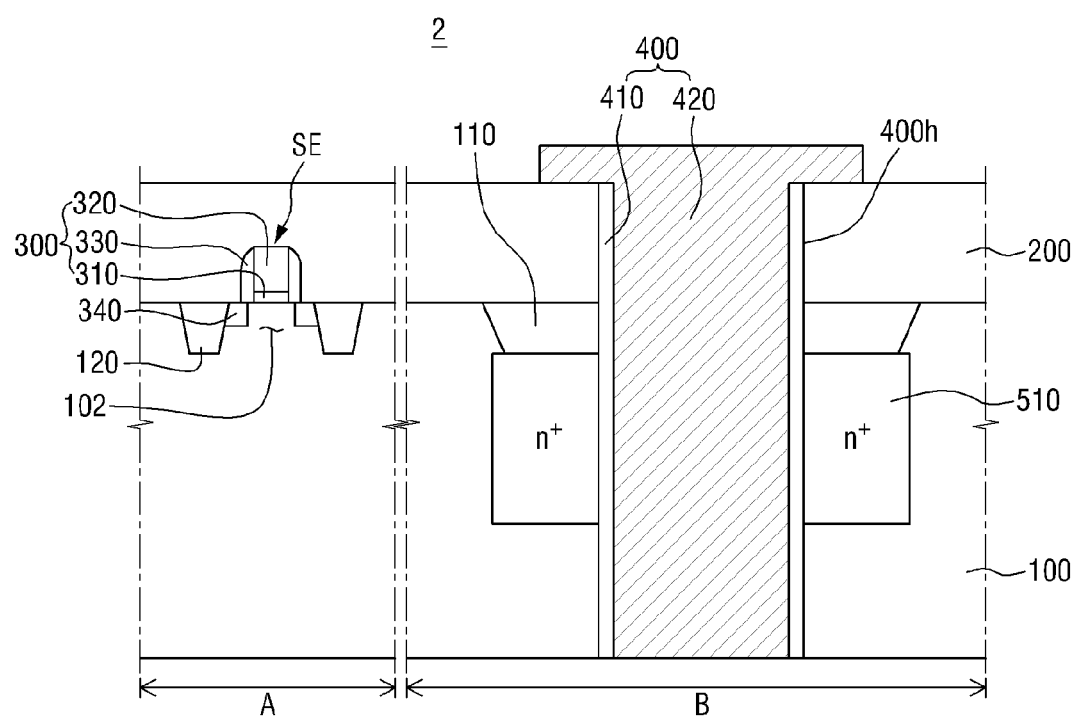
FIG. 3 is a cross-sectional view of a semiconductor device according to a second embodiment of the present inventive concept.

FIG. 3 is a cross-sectional view of a semiconductor device according to a second embodiment of the present inventive concept. For convenience in explanation, the explanation of substantially the same elements or features as those of the semiconductor device according to the first embodiment of the present inventive concept as described above will be omitted.

Referring to FIG. 3, according to a semiconductor device 2 according to the second embodiment of the present inventive concept, a first impurity region 510 may be formed to come in contact with a through-silicon via 400. For convenience in the process of fabricating the through-silicon via 400, the first impurity region 510 may be doped in a wide range, a via-hole 400h may be formed through etching of the center portion of the doped first impurity region 510, and a through-silicon via 400 may be formed to fill in the via-hole 400h. In the case, the through-silicon via 400 may be formed to come in contact with the first impurity region 510.

Figure 4:
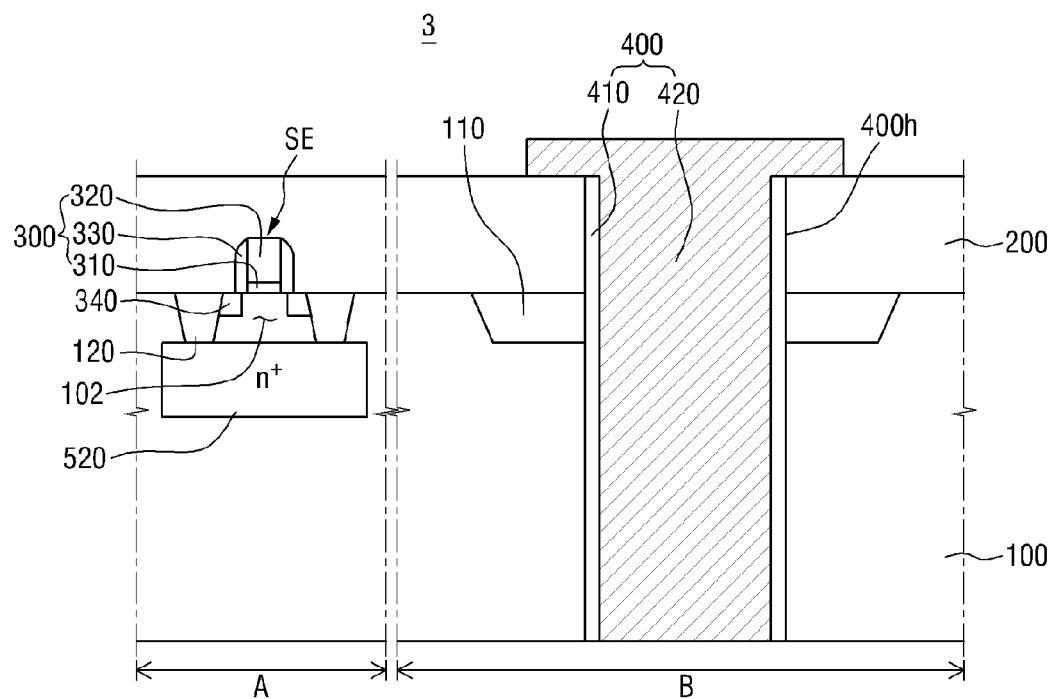
FIG. 4 is a cross-sectional view of a semiconductor device according to a third embodiment of the present inventive concept.

FIG. 4 is a cross-sectional view of a semiconductor device according to a third embodiment of the present inventive concept. For convenience in explanation, the explanation of substantially the same elements or features as those of the semiconductor device according to the first embodiment of the present inventive concept as described above will be omitted.

Referring to FIG. 4, a semiconductor device 3 according to the third embodiment may include a semiconductor substrate 100, a first isolation layer 110, a second isolation layer 120, an interlayer insulating layer 200, a semiconductor element SE including a gate structure 300, a through-silicon via 400, and a second impurity region 520.

The semiconductor substrate 100, the first isolation layer 110, the second isolation layer 120, the interlayer insulating layer 200, a semiconductor element SE including the gate structure 300, and the through-silicon via 400 are substantially the same as those as described above.

The second impurity region 520 may be arranged to overlap the gate structure 300 to in the semiconductor substrate 100. An active region 102 may be disposed on the second impurity region 520. The second impurity region 520 may be of a first conduction type, and the first conduction type may be, for example, an n-type. The second impurity region 520 may include for example, arsenic ions, or phosphorus ions. If the second impurity region 520 is doped with n-type impurities, p-type charges that are generated in the process of forming the through-silicon via 400 are combined with the n-type impurities to be removed.

The second impurity region 520 may be formed to come in contact with the second isolation layer 120. The second impurity region 520 may be formed below the second isolation layer 120. The second impurity region 520 may serve to remove charges that are generated in the process of forming the through-silicon via 400 and to protect the semiconductor element SE. Accordingly, if the second impurity region 520 may be formed to come in contact with the second isolation layer 120, the effect of intercepting the charges from being diffused into the semiconductor element SE can be increased. The doping concentration of the second impurity region 510 may be, for example, 1E14 to 1E16 ions/cm$^3$.

Figure 5:
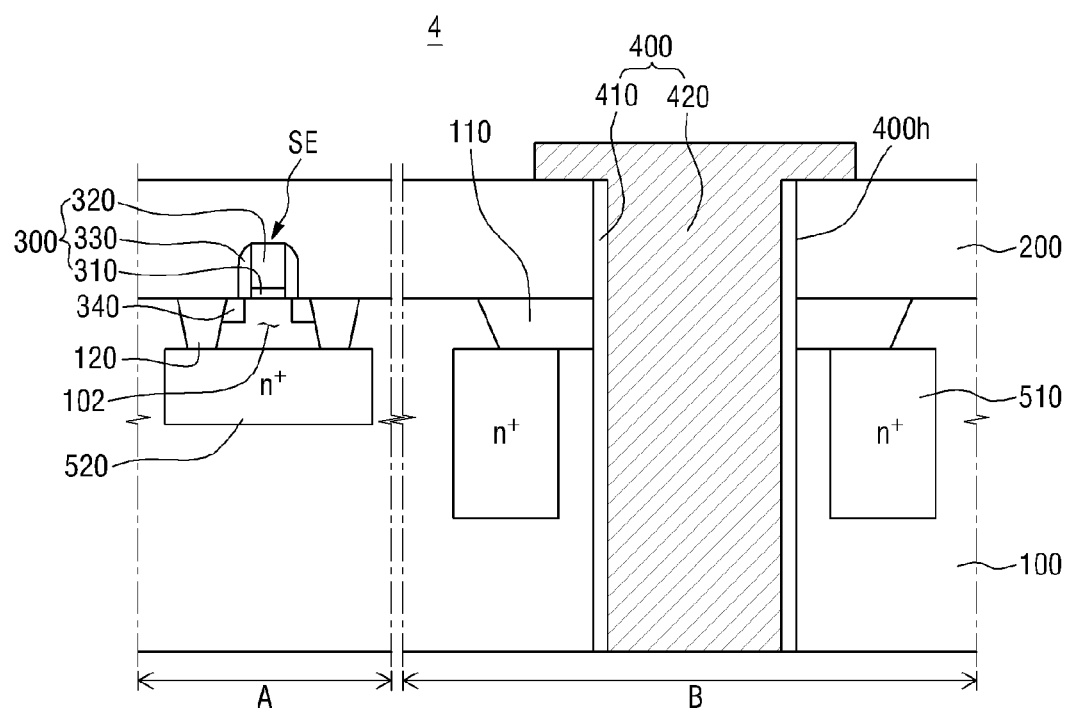
FIG. 5 is a cross-sectional view of a semiconductor device according to a fourth embodiment of the present inventive concept.

FIG. 5 is a cross-sectional view of a semiconductor device according to a fourth embodiment of the present inventive concept. For convenience in explanation, the explanation of substantially the same elements or features as those of the semiconductor device according to the first embodiment of the present inventive concept as described above will be omitted.

Referring to FIG. 5, a semiconductor device 4 according to the fourth embodiment of the present inventive concept may include a first impurity region 510 and a second impurity region 520. The first impurity region 510 may be formed to surround only a portion of the sidewall of a through-silicon via 400, and the second impurity region 520 may be arranged to overlap a gate structure 300 in a semiconductor substrate 100. An active region 102 may be disposed on the second impurity region 520. By forming the first impurity region 510 and the second impurity region 520 together, the effect of removing p-type charges that are generated in the process of forming the through-silicon via 400 can be increased. Further, in order to increase the effect of removing the p-type charges that are generated in the process of forming the through-silicon via 400, the first impurity region 510 may be formed to be spaced apart from the through-silicon via 400.

Figure 6:
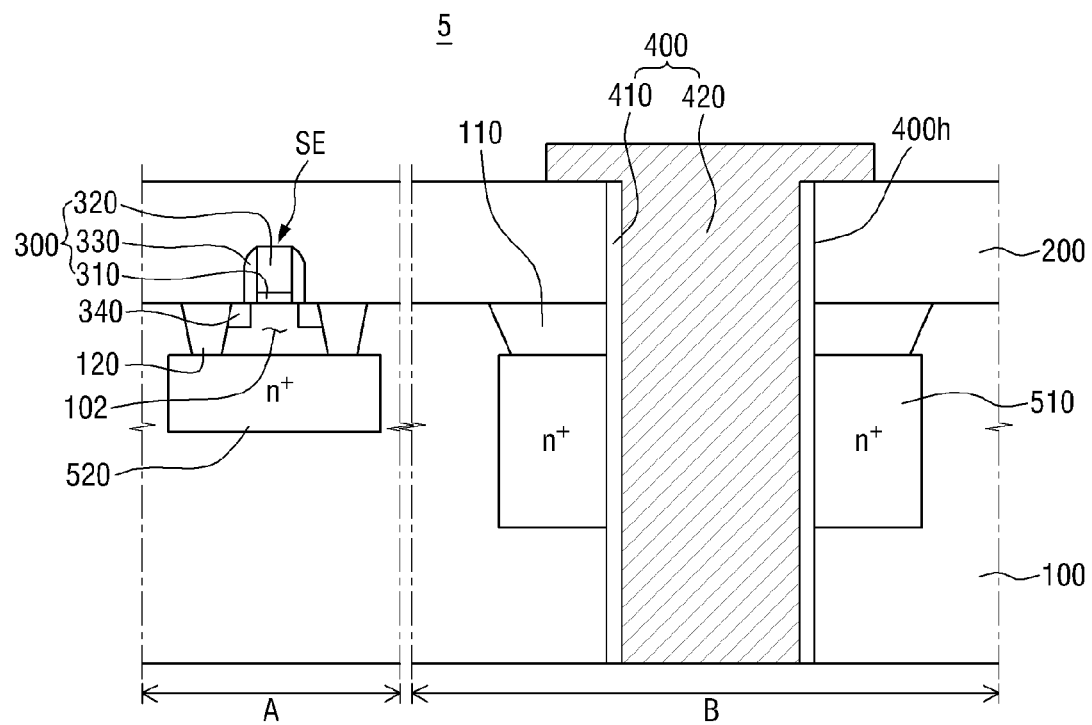
FIG. 6 is a cross-sectional view of a semiconductor device according to a fifth embodiment of the present inventive concept.

FIG. 6 is a cross-sectional view of a semiconductor device according to a fifth embodiment of the present inventive concept. For convenience in explanation, the explanation of substantially the same elements or features as those of the semiconductor device according to the first embodiment of the present inventive concept as described above will be omitted.

Referring to FIG. 6, a semiconductor device 5 according to the fifth embodiment of the present inventive concept may include a first impurity region 510 and a second impurity region 520. The first impurity region 510 may be formed to surround only a portion of the sidewall of a through-silicon via 400, and the second impurity region 520 may be arranged to overlap a gate structure 300 in a semiconductor substrate 100. An active region 102 may be disposed on the second impurity region 520. The first impurity region 510 and the second impurity region 520 may be doped with n-type impurities. For example, the first impurity region 510 and the second impurity region 520 may be doped with arsenic ions or phosphorus ions. Unlike the semiconductor device 4 according to the fourth embodiment of the present inventive concept, the first impurity region 510 may be formed to come in contact with the through-silicon via 400. For convenience in the process of fabricating the through-silicon via 400, the first impurity region 510 is doped in a wide range, a via-hole 400h is formed by etching of the center portion of the doped first impurity region 510, and the through-silicon via 400 is formed to fill in the via-hole 400h. In the case, the processing cost can be reduced.

Hereinafter, a method for fabricating a semiconductor device according to some embodiments of the present inventive concept will be described.

FIGS. 7 to 12 are views of intermediate steps explaining a method for fabricating a semiconductor device according to an embodiment of the present inventive concept.

Figure 7:
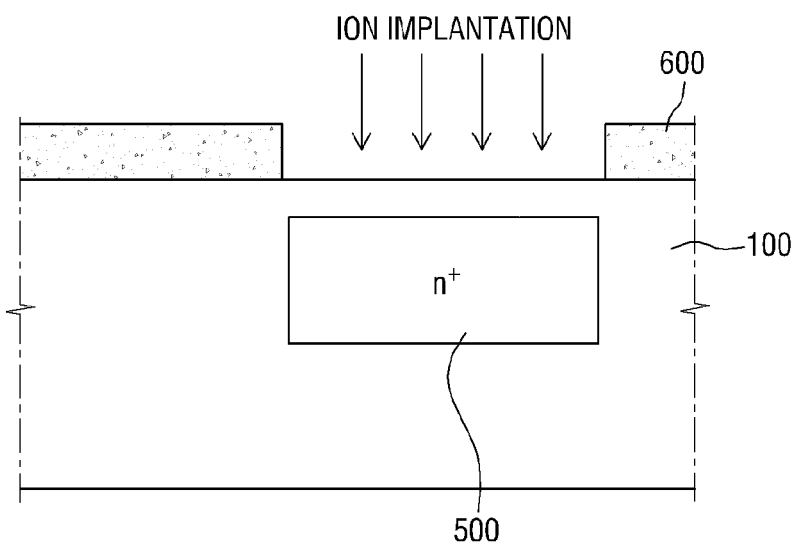
FIGS. 7 to 12 are views of intermediate steps explaining a method for fabricating a semiconductor device according to an embodiment of the present inventive concept.

First, referring to FIG. 7, according to a method for fabricating a semiconductor device according to an embodiment of the present inventive concept, a first conduction type impurity region 500 may be formed in a semiconductor substrate 100. A mask 600 to expose a position in which the impurity region 500 is to be formed is formed on the semiconductor substrate 100, and using ion implantation, the first conduction type impurity region 500 may be formed. In this case, the first conduction type may be an n-type. The first conduction type impurity region 500 may include for example, arsenic ions, or phosphorus ions. It is preferable that the impurity region 500 is formed to be doped with a first conduction type (e.g., n-type) impurities so that second conduction type (e.g., p-type) charges that are generated in a process of forming a through-silicon via 400 are combined with the first conduction type impurities to be removed.

Figure 8:
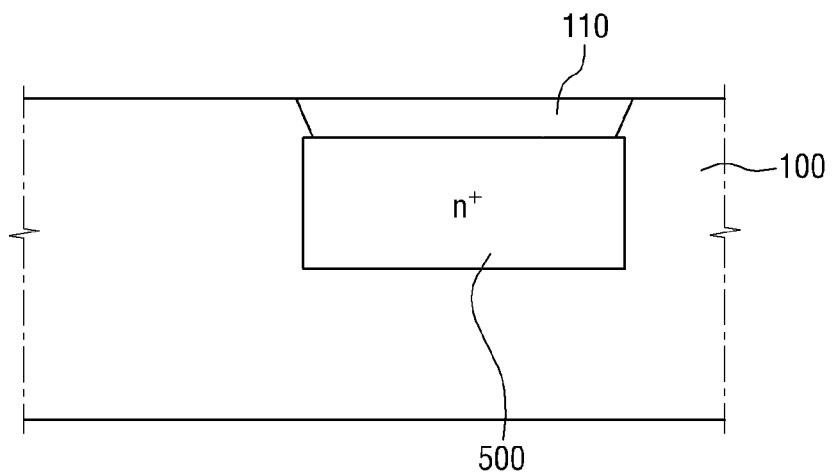

Then, referring to FIG. 8, a first isolation layer 110 is formed in the semiconductor device 100. The first isolation layer 110 may be formed to come in contact with the impurity region 500. The first isolation layer 110 may be formed using, for example, an STI process. An upper surface of the first isolation layer 110 may be put on the same plane as an upper surface of the semiconductor substrate 100, but is not limited thereto.

Figure 9:
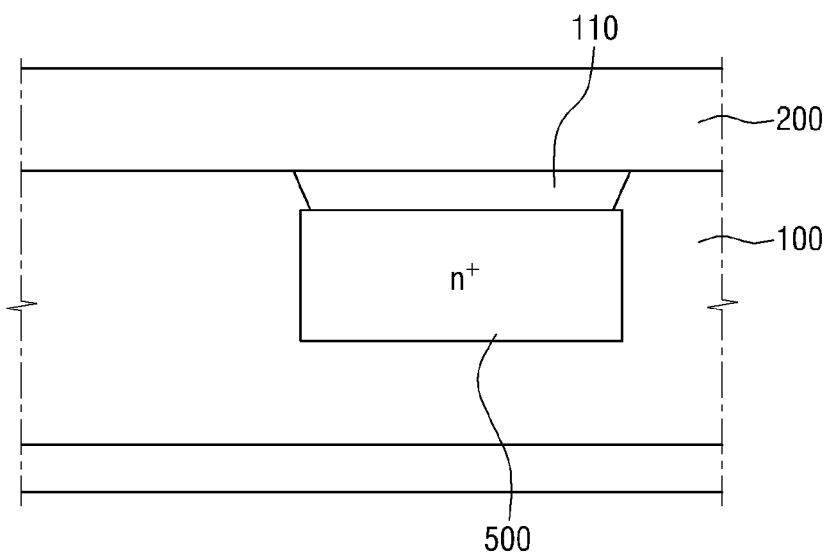

Then, referring to FIG. 9, an interlayer insulating layer 200 may be formed on the semiconductor device 100. The interlayer insulating layer 200 may serve to intercept an electrical connection between the semiconductor substrate 100 and other semiconductor elements. The interlayer insulating layer 200 may include a low-k material, and may be made of, for example, TOSZ, USG, BSG, PSG, BPSG, PRTEOS, FSG, or a combination thereof.

Figure 10:
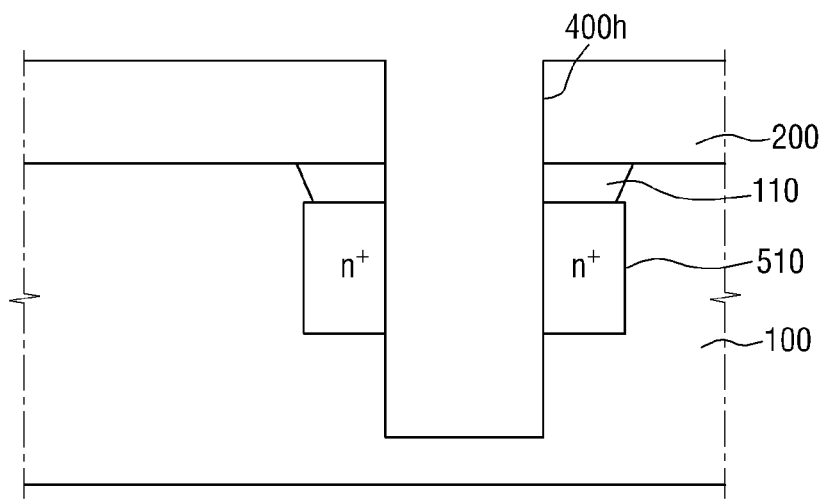

Then, referring to FIG. 10, a via-hole 400h may be formed to penetrate the semiconductor substrate 100, the interlayer insulating layer 200, and the first isolation layer 110. In this case, the via-hole 400h may be formed to penetrate a center portion of the impurity region 500. The impurity region 500 serves to remove charges (e.g., p-type charges) that are generated when the via-hole 400h is formed through reaction of the charges and the n-type impurities.

Figure 11:
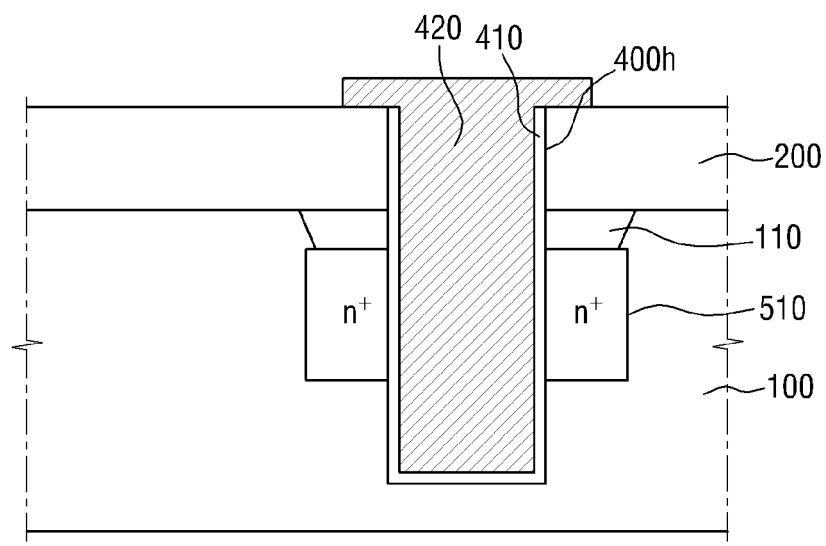
Figure 12:
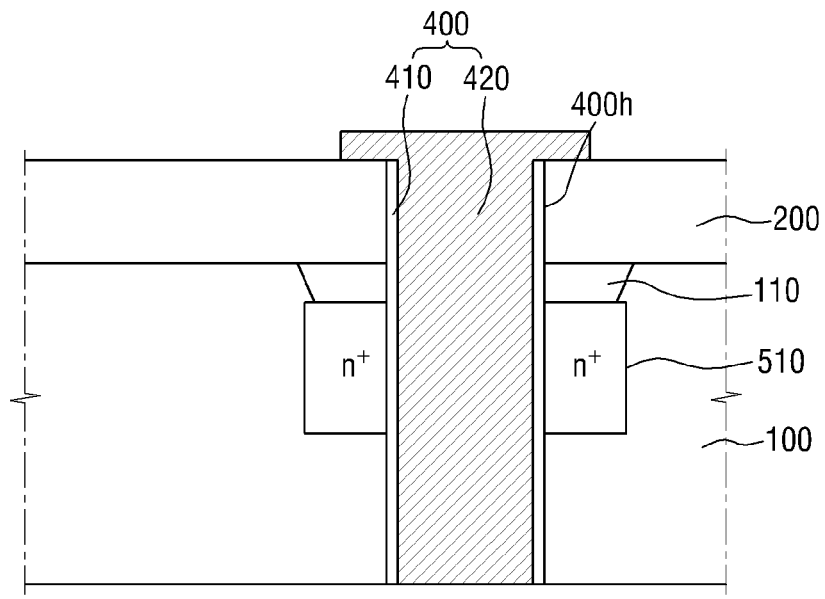

Then, referring to FIGS. 11 and 12, the through-silicon via 400 may be formed by successively forming an insulating layer 410 and a conductive layer 420 in the via-hole 400h to fill the via-hole 400h. The first impurity region 510 has a structure that is formed to come in contact with the through-silicon via 400. A lower portion of the semiconductor substrate 100 may be grinded to expose a lower surface of the through-silicon via 400.

FIGS. 13 to 18 are views of intermediate steps explaining a method for fabricating a semiconductor device according to another embodiment of the present inventive concept. For convenience in explanation, the explanation of substantially the same elements or features as those of the method for fabricating the semiconductor device according to the embodiment of the present inventive concept described above referring to FIGS. 7 to 12 will be omitted.

Figure 13:
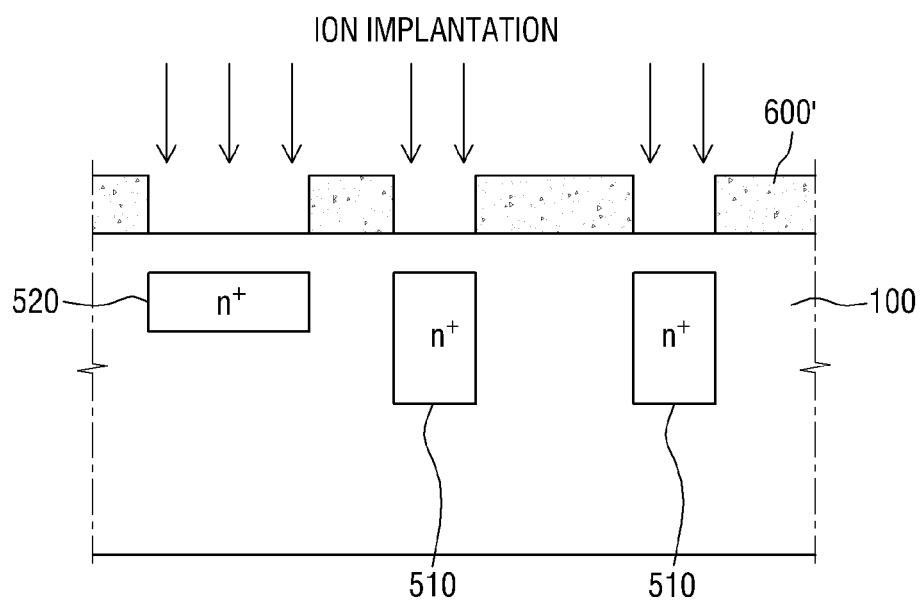
FIGS. 13 to 18 are views of intermediate steps explaining a method for fabricating a semiconductor device according to another embodiment of the present inventive concept.

First, referring to FIG. 13, according to a method for fabricating a semiconductor device according to another embodiment of the present inventive concept, a first impurity region 510 and a second impurity region 520 may be simultaneously formed in a semiconductor substrate 100. A mask 600' to expose a position in which the first impurity region 510 and the second impurity region 520 are to be formed may be formed on the semiconductor substrate 100, and using ion implantation, the first conduction type first impurity region 510 and second impurity region 520 may be formed. In this case, the first conduction type may be an n-type. The first conduction type first impurity region 510 and second impurity region 520 may include for example, arsenic ions, or phosphorus ions. It is to preferable that the first impurity region 510 and the second impurity region 520 are formed to be doped with first conduction type impurities so that second conduction type (e.g., p-type) charges that are generated in a process of forming a through-silicon via 400 are combined with the first conduction type impurities to be removed.

Figure 14:
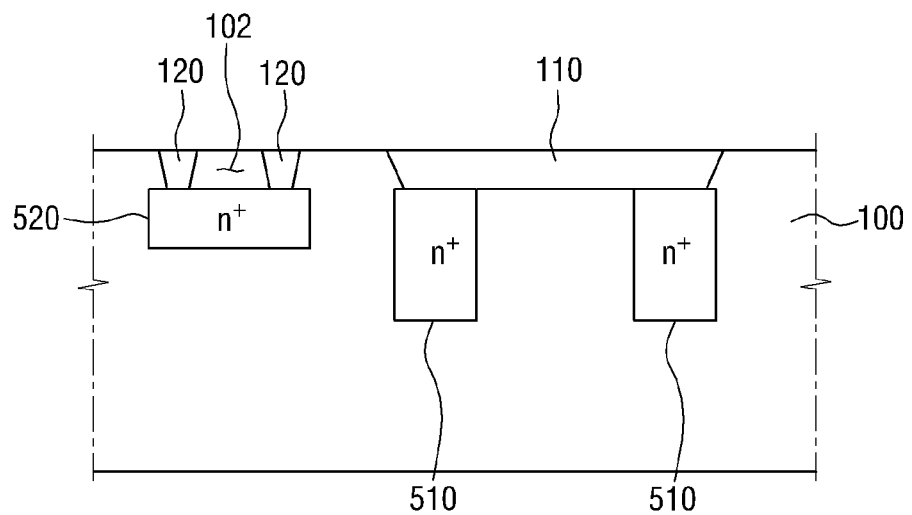

Then, referring to FIG. 14, a first isolation layer 110 and a second isolation layer 120 may be formed in the semiconductor device 100. The first isolation layer 110 may be formed to come in contact with the first impurity region 510, and the second isolation layer 120 may be formed to come in contact with the second impurity region 520. The first isolation layer 110 and the second isolation layer 120 may be formed using, for example, a STI process. The second isolation layer 120 may define an active region 102. The active region 102 may be disposed on the second impurity region 520. Upper surfaces of the first isolation layer 110 and the second isolation layer 120 may be put on the same plane as an upper surface of the semiconductor substrate 100, but are not limited thereto.

Figure 15:
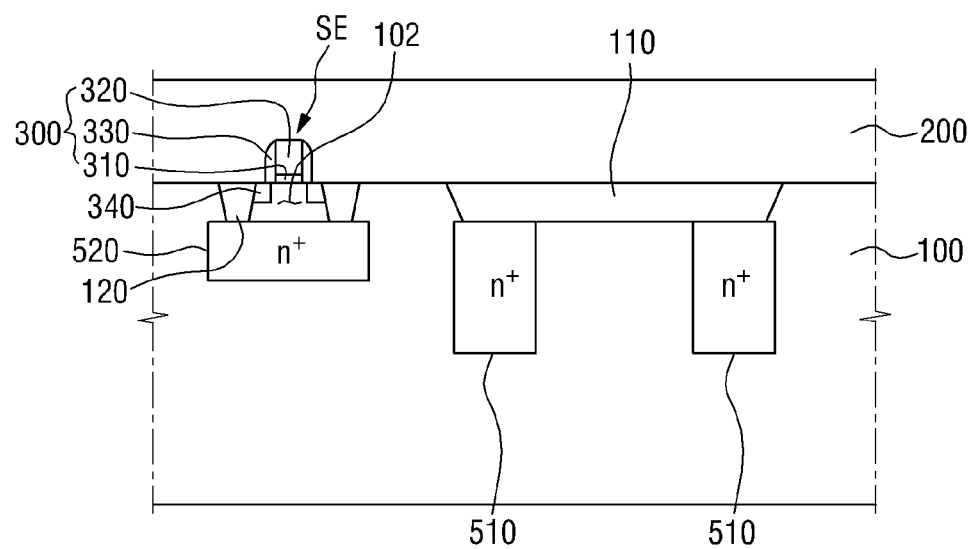

Then, referring to FIG. 15, a semiconductor element SE including a gate structure 300 and source/drains 340 may be formed on the semiconductor substrate 100 of the active region 102 defined by the second isolation layer 120. The gate structure 300 may be formed on the semiconductor substrate 100 of the active region 102 defined by the second isolation layer 120. The gate structure 300 may be formed to overlap the second impurity region 520. The gate structure 300 may include a gate insulating layer 310 formed on the semiconductor substrate, a gate electrode 320 formed on the gate insulating layer 310, and a spacer 330 formed on a side wall of the gate electrode 320.

The source/drains 340 may be formed in the semiconductor substrate 100 of the active region 102 adjacent to the gate structure 300. The source/drains 340 may be formed by doping impurities in the semiconductor substrate 100 adjacent to the gate structure 300 using an ion implantation process. An interlayer insulating layer 200 may be formed on the semiconductor substrate 100 to cover the semiconductor element SE.

Figure 16:
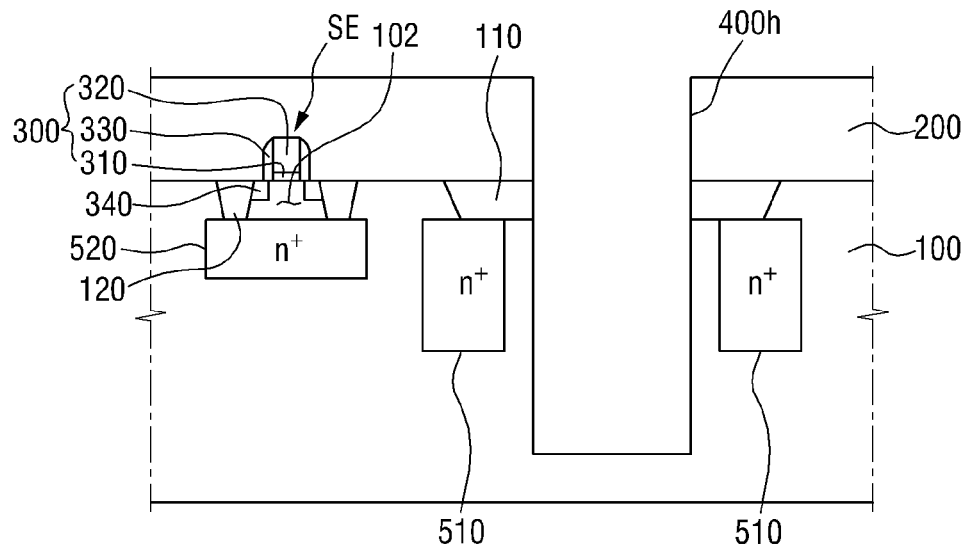
Figure 17:
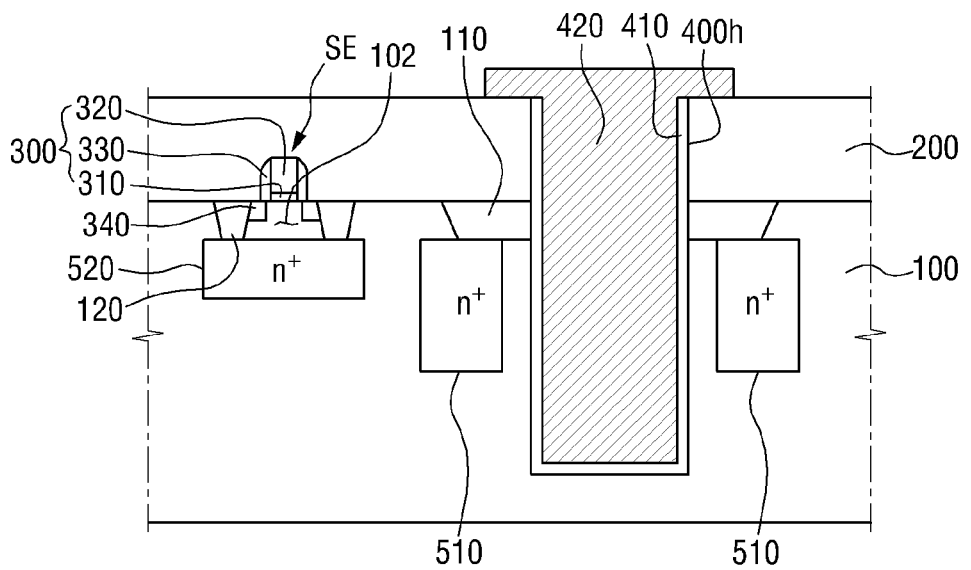
Figure 18:
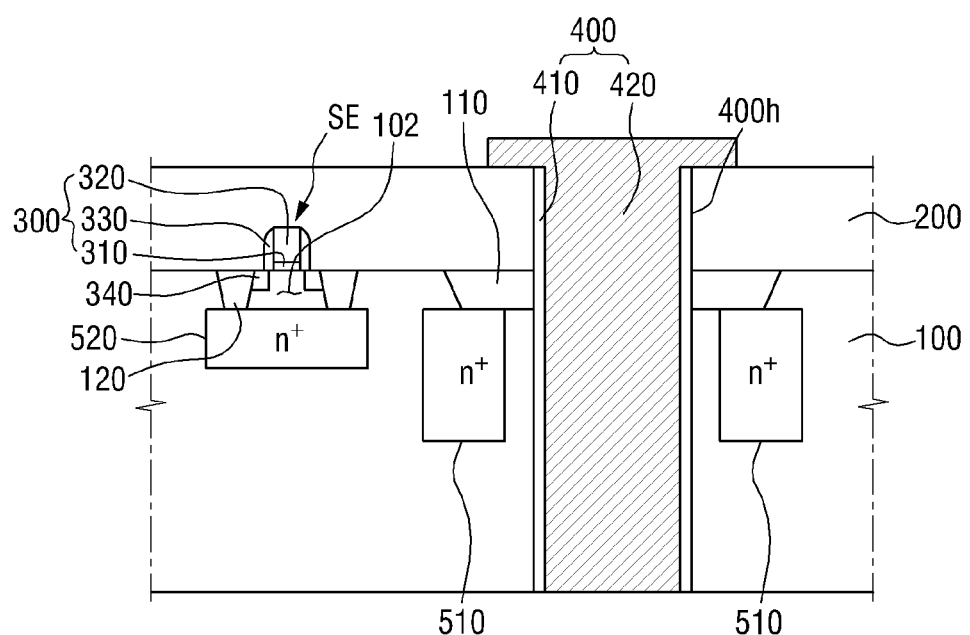

Then, referring to FIG. 16, a via-hole 400h may be formed to penetrate the semiconductor substrate 100, the interlayer insulating layer 200, and the first isolation layer 110, and formed to be spaced apart from the portion where the first impurity region 510 is formed. Then, referring to FIGS. 17 and 18, the through-silicon via 400 is formed by successively forming an insulating layer 410 and a conductive layer 420 in the via-hole 400h to fill the via-hole 400h. The through-silicon via 400 the first impurity region 510 may have a structure that is formed to be spaced apart from the first impurity region 510. A lower portion of the semiconductor substrate 100 may be grinded to expose a lower surface of the through-silicon via 400.

Figure 19:
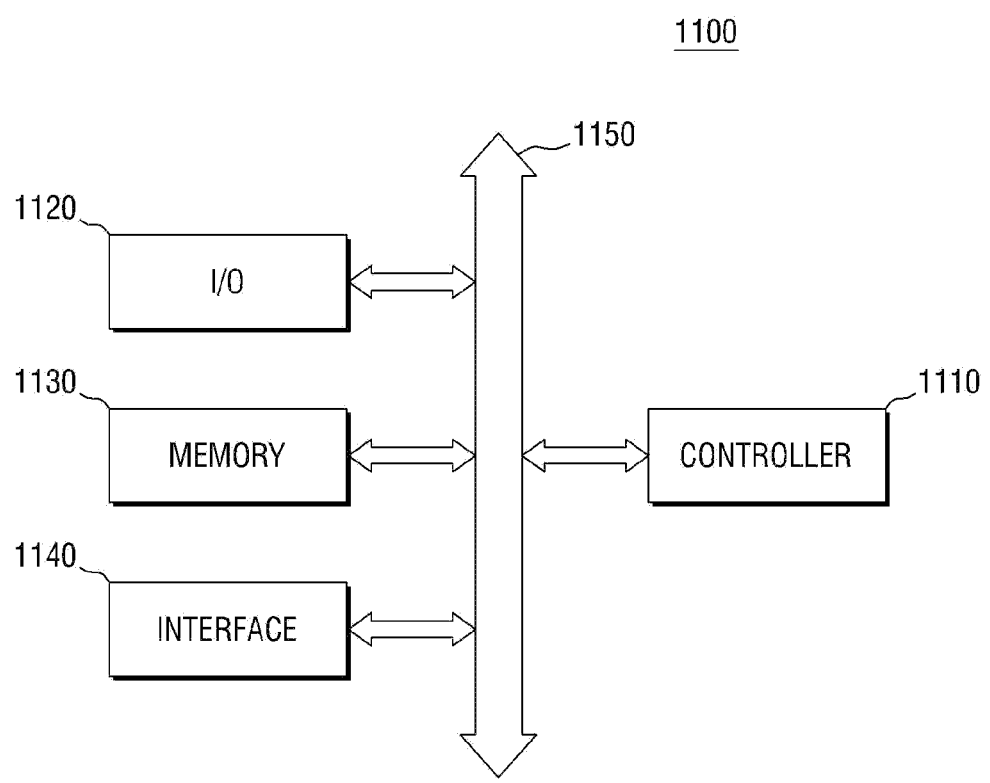
FIG. 19 is a block diagram of an electronic system including a semiconductor device according to some embodiments of the present inventive concept.

FIG. 19 is a block diagram of an electronic system including a semiconductor device according to some embodiments of the present inventive concept.

Referring to FIG. 19, an electronic system 1100 according to an embodiment of the present inventive concept may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions.

The I/O device 1120 may include a keypad, a keyboard, and a display device.

The memory 1130 may store data and/or commands.

The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 20:
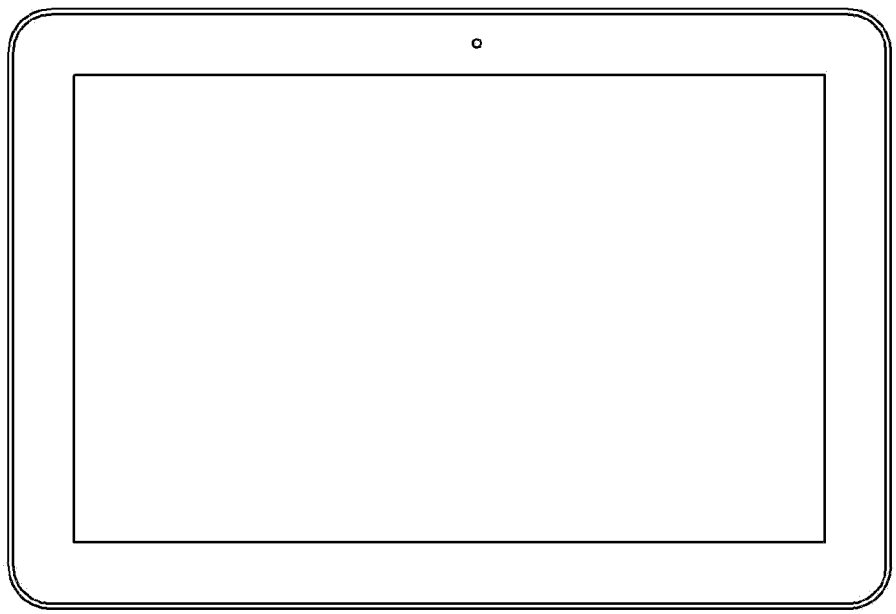
FIGS. 20 and 21 are exemplary views illustrating an electronic device to which a semiconductor device according to some embodiments of the present inventive concept can be applied.
Figure 21:
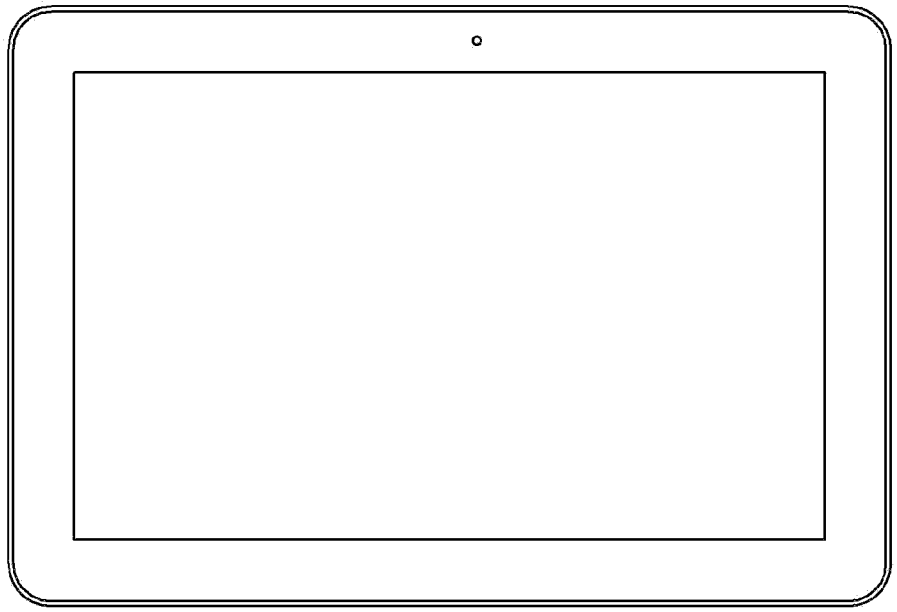

FIGS. 20 and 21 are exemplary views illustrating an electronic device to which a semiconductor device fabricated according to some embodiments of the present inventive concept can be applied. FIG. 20 illustrates a tablet PC, and FIG. 21 illustrates a notebook PC. At least one of the semiconductor devices 1 to 5 according to the embodiments of the present inventive concept may be used in the tablet PC or the notebook PC. It is apparent to those of skill in the art that the semiconductor devices according to some embodiments of the present inventive concept can be applied even to other integrated circuit devices that have not been exemplified.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A semiconductor device comprising:
   a semiconductor substrate including a first region and a second region;
   an interlayer insulating layer formed on the semiconductor substrate;
   a semiconductor element formed on the semiconductor substrate in the first region, the semiconductor element including a gate structure formed in the interlayer insulating layer;
   an isolation layer formed in the semiconductor substrate in the second region;
   a through-silicon via formed to penetrate the semiconductor substrate, the interlayer insulating layer, and the isolation layer in the second region;
   a first conduction type first impurity region contacting with the isolation layer and the through-silicon via and formed to surround only a portion of a sidewall of the through-silicon via in the semiconductor substrate in the second region; and
   a first conduction type second impurity region arranged to overlap the gate structure in the semiconductor substrate in the first region,
   wherein the first impurity region and the second impurity region are separated from each other.

2. The semiconductor device of claim 1, wherein a depth of first impurity region is shallower than a depth of the through-silicon via.

3. The semiconductor device of claim 1, wherein the first conduction type is an n-type.

4. The semiconductor device of claim 1, wherein a doping concentration of the first impurity region is 1E14 ions/cm3 to 1E16 ions/cm3.

5. The semiconductor device of claim 1, wherein the first and second impurity regions intercept diffusion of a second conduction type charges into the semiconductor element.

6. The semiconductor device of claim 1, wherein the first impurity region is below the isolation layer.

7. The semiconductor device of claim 1, wherein the gate structure includes a gate insulating layer on the semiconductor substrate, a gate electrode on the gate insulating layer, and a spacer on a side wall of the gate electrode.

8. The semiconductor device of claim 7, further comprising a first conduction type second impurity region surrounding only a portion of a sidewall of the through-silicon via in the semiconductor substrate.

9. A semiconductor device comprising:
   a semiconductor substrate comprising a first region and a second region;
   an interlayer insulating layer on the semiconductor substrate;
   a semiconductor element on the semiconductor substrate in the first region of the semiconductor substrate, the semiconductor element including a gate structure in the interlayer insulating layer;
   a first isolation layer in the semiconductor substrate in the first region of the semiconductor substrate;

a via hole in the second region of the semiconductor substrate, the via hole penetrating the semiconductor substrate and the interlayer insulating layer;

a through-silicon via in the via hole; and a first conduction type first impurity region contacting the first isolation layer and arranged to overlap the gate structure in the semiconductor substrate to intercept diffusion of a second conduction type charges into the semiconductor element.

10. A semiconductor device comprising:

a semiconductor substrate including a first region and a second region;

an interlayer insulating layer on the semiconductor substrate;

a semiconductor element on the semiconductor substrate in the first region, the semiconductor element including a gate structure;

a first isolation layer in the semiconductor substrate, the first isolation layer defining the first region;

a second isolation layer in the semiconductor substrate in the second region;

a through-silicon via penetrating the semiconductor substrate, the interlayer insulating layer, and the isolation layer in the second region;

a first conduction type first impurity region contacting with the through-silicon via and surrounding only a portion of a sidewall of the through-silicon via in the semiconductor substrate in the second region; and a first conduction type second impurity region contacting the first isolation layer and arranged to overlap the gate structure in the semiconductor substrate in the first region.

11. The semiconductor device claim 10, wherein a depth of first impurity region is shallower than a depth of the through-silicon via.

12. The semiconductor device of claim 10, wherein the first conduction type is an n-type.

13. The semiconductor device claim 10, wherein the first conduction type first impurity region is formed to come in contact with the second isolation layer.

* * * * *